United States Patent [19]

Mackiewicz et al.

[11] Patent Number: 4,713,756
[45] Date of Patent: Dec. 15, 1987

[54] NON-VOLATILE MEMORY DEVICE FOR A PROGRAMMABLE CONTROLLER

[75] Inventors: Ralph E. Mackiewicz, Madison Heights; Michael A. Kuhn, Royal Oak, both of Mich.

[73] Assignee: Westinghouse Electric Corp., Pittsburgh, Pa.

[21] Appl. No.: 706,571

[22] Filed: Feb. 28, 1985

[51] Int. Cl.$^4$ .................. G06F 1/00; G06F 13/00
[52] U.S. Cl. .................... 364/200; 365/228
[58] Field of Search ... 364/200 MS File, 900 MS File; 365/228, 229; 371/10, 66

[56] References Cited

U.S. PATENT DOCUMENTS

| | | | |
|---|---|---|---|
| 3,859,638 | 1/1975 | Hume, Jr. | 365/229 |
| 3,959,778 | 5/1976 | Brette | 340/172.5 |
| 4,234,920 | 11/1980 | Van Ness et al. | 364/200 |
| 4,421,977 | 12/1983 | Kittredge | 364/900 |
| 4,458,307 | 7/1984 | McAnlis et al. | 364/200 |
| 4,507,744 | 3/1985 | McFiggons et al. | 364/708 |
| 4,607,351 | 8/1986 | Gerber et al. | 365/228 |

OTHER PUBLICATIONS

Koch, Bud, "Nonvolatile Static RAM 'Snapshots' Data into E$^2$PROM", *Electonic Products*, Dec. 1980, p. 75.
Modicon, Product Sales Literature for Modicon P371 Program Pack.
Modicon, Operating Guide for Modicon P371 Program Pack, pp. 8-1, 8-2.
Xicor, Inc., Specification Sheets for Xicor NOVRAM Memories, Nonvolatile Static RAMS, Mar. 1982, pp. 1–6.

*Primary Examiner*—Thomas M. Heckler
*Assistant Examiner*—Kevin A. Kriess
*Attorney, Agent, or Firm*—M. J. Moran

[57] ABSTRACT

A nonvolatile memory storage device for a programmable controller to provide an archival back-up for user programs with the use of a battery or other alternate back-up power source. The device can be attached to the programmable controller using a frangible tampering indicator that will break on the removable of the device from the programmable controller.

14 Claims, 3 Drawing Figures

NON-VOLATILE MEMORY DEVICE FOR A PROGRAMMABLE CONTROLLER

FIELD OF THE INVENTION

The subject matter of this invention relates generally to programmable controllers and specifically to non-volatile memory devices that can be used with a programmable controller.

BACKGROUND OF THE INVENTION

A programmable controller (PC) is a solid state device designed to perform logical decision making for control applications in an industrial environment. The PC performs logic operations as well as simulating analog controllers. Because the PC is a digital device, the information which is processed is normally stored in a binary form in solid state memories. Typically two types of memory are provided in a PC. These being read only memory (ROM) and random access memory (RAM). The information contained in the ROM is information that is required for the internal operation of the PC after it is initially energized. This information includes the housekeeping chores such as initialization routines, routines for checking the status of the memory, as well as checking the status of the input and output devices. This is information which is essential for the operation of the PC and is independent of any user program that is later entered into the PC for the controlling of input and output devices. Because the information written into the ROM is retained when the ROM is deenergized, this device is the preferred device for retaining the housekeeping routines within the programmable controller.

With RAM, data can be read from as well as written into the device. The RAM of a PC can be thought of as being logically partitioned into various segments—one being the dynamic portion of RAM, the other the static portion of RAM. Variable data is kept in the dynamic portion of RAM while infrequently changed data is kept in the static portion of RAM. Typically, the static portion of RAM is used for storing the user program that sets forth the decision-making criteria that are used to control the output devices. A programming panel, connected to the programmable controller, is used to enter the user program into memory. After the user program has been entered into RAM, the states of various input and output devices connected to the PC are periodically sampled and updated. During the sampling process, information concerning the real world status of the input devices and output devices is written into the dynamic portion of RAM. During solving of the user program, information representing the status of the input and output devices and the portion of the user program undergoing solution are jointly sent to the processor or in the PC. At the processor, a solution is derived concerning the status of various output devices as a function of the user program and the real world status of the input devices that was obtained from the RAM. As each line of the user program is processed, the solution thereto is stored in RAM. When the entire program has been processed, the stored solution is used to update the status of the output devices. Because solid state devices are used, one scan or pass which includes reading the status of the inputs and outputs, solving the user program and updating the outputs can take place within a time period of less than a second. This time period is also known as the scan time of the PC.

The user program is the map that guides the PC and without which the PC could not function. Because the user program can be quite lengthy and time consuming to enter into the memory, an important feature of any PC has always been the availability of non-volatile memory. In the past magnetic core memory or battery backed-up CMOS RAM were typically used. The drawbacks with these approaches is that magnetic core memory is expensive in comparison to other types of memory devices while the batteries used to power the CMOS RAM require maintenance. Another means of providing non-volatile memory would be to place the user program into ROM. However ROM devices usually cannot be directly programmed while installed in a circuit. This is because they require higher level voltages for programming than are normally found in a typical programmable controller. A further approach uses a hybrid device having the read/write capabilities of RAM while also having the non-volatility of ROM. This device is known as an electrically erasable programmable read only memories (EEPROM). Memory devices constructed using this technology are able to be erased and reprogrammed while still in a circuit. The drawbacks with this device is that they could be programmed only a limited number of times. Also it takes several milliseconds to write data into an EEPROM device. In comparison a CMOS RAM requires only fractions of a microsecond for data to be written into them. If EEPROMs were used as replacements for CMOS RAM, they would severely degrade the scan times of the programmable controller due to the length of time required to write data into the EEPROMs. Also, because the EEPROM can be written to only a limited number of times, the lifetime of the PC would also be adversely affected. It would be advantageous therefore to have a low cost, maintenance free form of non-volatile memory that overcomes the technical disadvantages of using EEPROM.

SUMMARY OF THE INVENTION

The invention comprises a non-volatile memory device that is removably attached to an external interface on the PC. The interface serves to connect the data bus of the PC with that of the memory device. The interface brings out the data bus of the PC consisting of address, data, and control lines and connects them with the corresponding address, data, and control lines of the memory device data bus. This establishes the data pathways through which information is exchanged between the programmable controller and the memory device. In addition to the data bus the memory device also comprises an interface connection for removably attaching the memory device to the external interface of the programmable controller. A non-volatile RAM is connected to the memory device data bus for storing information received via the data. The non-volatile RAM retains the information contained therein during periods of time when the programmable controller is deenergized. This information is retained without the use of auxiliary power supplies such as batteries. An input port and an output port which are connected to the memory device data bus are also provided. The input port receives external signals including a LOAD signal for the loading of information contained in the non-volatile RAM into the PC and a STORE signal for the writing of information from the PC into the non-volatile RAM of the memory device. The LOAD signal and STORE signal are transmitted to the processor of the PC when they occur. The output port, which is connected to the data bus, provides a BUSY indicator when information is being exchanged between the memory device and the PC. In addition, gate circuits that are responsive to the processor of the PC are used to coordinate the actions of the input port, the output port and the non-volatile RAM. When enabled by the processor the gating circuits control the direction of information flow into and out of the non-volatile RAM in response to the occurrence of the STORE and LOAD signals, respectively. The gating circuit also enables the output port to provide the busy signal and disables the input port until the transfer of information between the memory device and the programmable controller has been completed.

Memory contained in the memory device is of two types. The first is a standard EEPROM array. The other is called a shadow RAM. In a shadow RAM there is a standard NMOS RAM array shadowed by an equal amount of EEPROM. In a shadow RAM each memory cell of the NMOS RAM array is overlayed cell for cell by the EEPROM array. All the information contained in the NMOS RAM array is written into the overlaid EEPROM array on the occurrence of a single WRITE pulse to the shadow RAM. In operation when the STORE signal is received on the input port, the BUSY light is activated by the processor and the PC stores the information contained in the dynamic portion of RAM into the shadow RAM with the exception of the input/output status information and stores the information contained in its static portion RAM into the EEPROM. When the LOAD signal is received the data contained in the shadow RAM and the EEPROM is transferred back into the PC. Both the LOAD and STORE operations can be done without requiring a program loader or programming panel, both costly in comparison to the memory device. In an alternate embodiment of the invention the STORE feature of the memory device can be disabled, thereby preventing any preprogrammed data in the shadow RAM or the EEPROM from being overwritten by information contained in the PC. The LOAD and STORE operations allow the memory device to operate as a form of archival storage for the program that was in the PC.

In a further embodiment a frangible tampering indicator can be attached between the memory device and the PC. The tampering indicator is broken on the disconnection of the memory device from the external interface of the PC. The broken tampering indicator provides a visual indication of an unauthorized removal of the memory device. The tampering indicator would be used where the memory device contains preprogrammed information that must be protected from unauthorized changes that can be performed if the memory device were disconnected from the PC.

With the memory device attached with the tampering indicator it will operate as a non-volatile storage medium for the programmable controller. When the PC is deenergized or powered down, an output thereof provides the STORE signal to the memory device allowing the data contained in the dynamic portion of the PC RAM memory to be automatically written into the non-volatile memory of the memory device. The static portion of the PC RAM memory is not transferred at this time as it would take too long to write this information into the EEPROM of the memory. When the PC is energized or powered up, an output thereof can provide the LOAD signal to the memory device thereby causing the loading or reading of the data stored therein into the PC. Although the memory in the PC is still volatile CMOS RAM with the memory device attached, the PC operates as though it had a non-volatile memory. With this implementation the long write times normally needed for the transfer of information into the EEPROMs are avoided.

BRIEF DESCRIPTION OF THE DRAWINGS

For a better understanding of the invention reference may be made to the embodiment exemplary of the invention shown in the accompanying drawings wherein.

DETAILED DESCRIPTION

Figure 1:
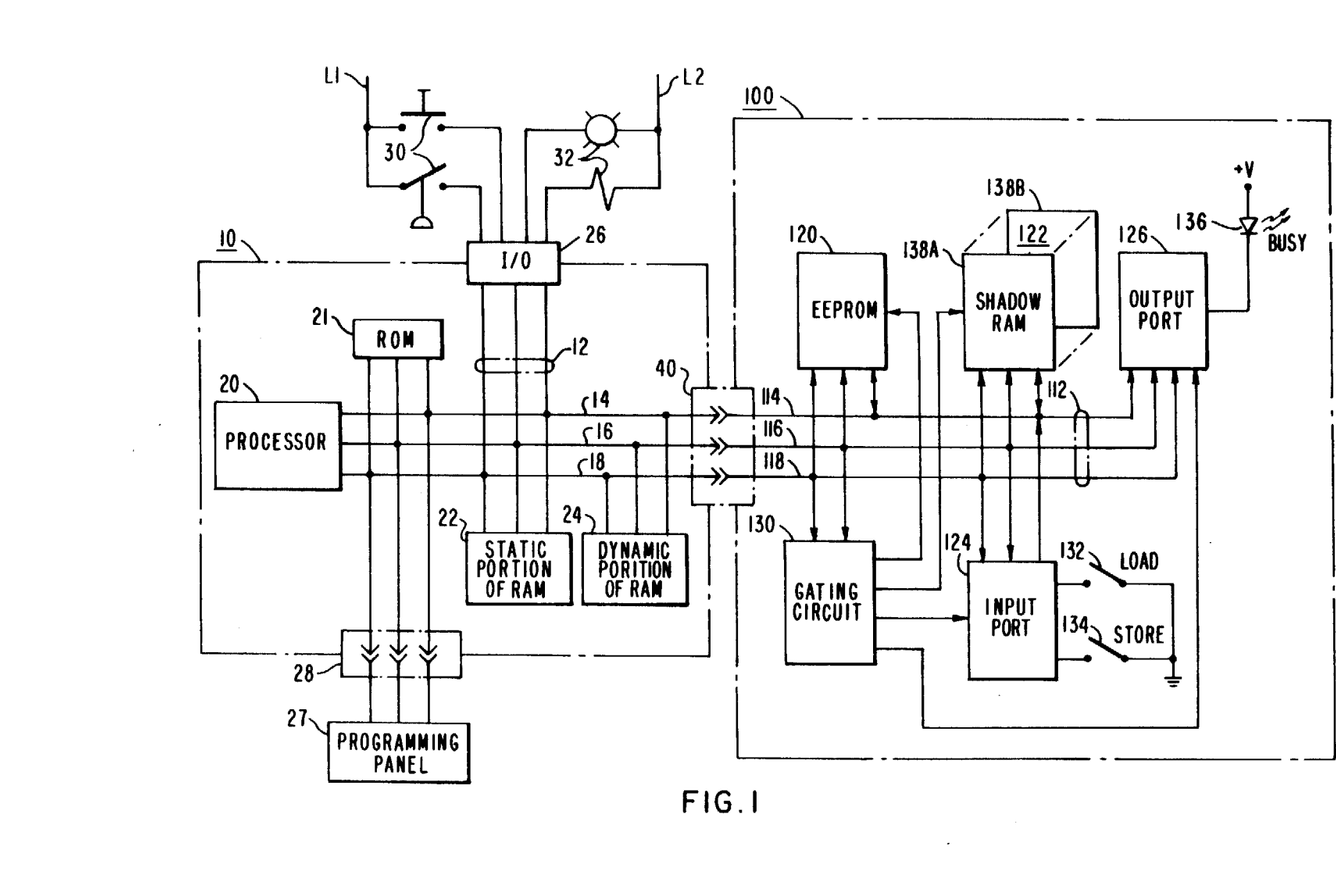
FIG. 1 is a simplified block diagram of a circuit embodying the present invention.

Shown in FIG. 1 is a programmable controller 10 having attached thereto a non-volatile memory device 100 embodying the present invention. Included in the programmable controller is a data bus 12 having data lines 14, address lines 16 and control lines 18. Attached to the data bus 12 are a processor 20, a ROM memory 21, static portion 22 of RAM memory, dynamic portion 24 of RAM memory, I/O (input/output) interface 26. The ROM memory 21 is used to store the initialization routines and other housekeeping routines necessary for operation of the PC. A programming panel 27 used primarily for entering a user program directly into the PC 10 can also be attached to the data bus 12 as shown at the additional interface 28. Individual external input devices 30 and output devices 32 are connected to the PC via this I/O interface 26. Also attached to the data bus 12 of the PC is an external interface 40 to which the memory device 100 attaches. The memory device 100 has a data bus 112 having data lines 114, address lines 116 and control lines 118 corresponding to those in the PC memory bus 12. Connected to the memory device data bus 112 is a EEPROM array 120, a shadow RAM array 122, an input port 124, an output port 126 and a gating circuit 130. The EEPROM array 120 is used to store what is referred to as static information. This is information such as the user program which does not change on a frequent basis. The shadow RAM array 122 is used to retain dynamic memory information. This is information that is continually being updated as the programmable controller solves the user program. Information contained in the shadow RAM array 122 typically includes variables that are likely to change such as the status of the contents of various timers and counters that may be used in the user's program. Storage of the status data of the input and output devices is of little value in that when the memory device is used the programmable controller system is either being powered up or being powered down. During a power-up situation, the processor will poll the input and output devices to determine their status. During a power-down situation, the PC is not being used to control; thus, the status of the inputs and outputs is immaterial during this period of time. By not storing the input and output device status data, memory space is conserved in the memory device.

The input port 124 is used to transmit the LOAD and STORE signals here represented by switches 132 and 134 respectively to the processor 20 via the data buses 12 and 112. The LOAD signal informs the processor 20 that information contained in the non-volatile RAM of the memory device 100, that is the EEPROM array 120 and the shadow RAM array 122 is ready to be transferred to the memory of the PC 10. In a similar fashion on receipt of a STORE signal, the processor 20 is requested to transfer the information contained in the memory circuits 22 and 24 of the programmable controller to the non-volatile memory of the memory device 100. The gating circuit 130 which is under the control of the processor 20 controls the direction of information flow between the memory device 100 and the PC 10. When information is being exchanged between the PC 10 and the memory device 100, the output port 126 is enabled to provide the BUSY indication signal represented by the light emitting diode 136. Simultaneously therewith, the input port 124 is disabled until the exchange of information has been completed.

As stated previously, the shadow RAM array 122 is a static RAM array 138A that is overlayed cell for cell with a corresponding EEPROM array 138B. Because of the one-for-one correspondence between the two arrays involved in the shadow RAM array 122, information can be rapidly entered into the EEPROM from the static RAM. Data entering the static RAM array 138A fabricated from NMOS type semiconductors is entered one element at a time. Typically, this requires approximately 450 nanoseconds per element plus about one microsecond for instruction execution by the processor 20. With N elements involved in the array, the time for the reading or writing of data into the static RAM array 138A of the shadow RAM would be N times 1.450 microseconds. Typical read/write times for an EEPROM array are approximately 10 milliseconds per element. However, because all the elements in the EEPROM array 138B involved in the shadow RAM 122 are directly written into from their corresponding static RAM array 138A, the total time required to transfer the information from one array to the other would be 10 milliseconds. Thus the total read/write time for the shadow RAM 122 having N elements would be N times 1.450 microseconds plus 10 milliseconds. In comparison the EEPROM array 120 having N elements that is used for the static information would have a write time of N times 10 milliseconds. Thus a significant savings in time is achieved by using the shadow RAM 122.

A solid state device having the characteristics required by the shadow RAM array 122 is described in the product literature of XICOR, Inc, 851 Buckeye Court, Milpitas, Calif. 95035 for their 5 volt, programmable, nonvolatile static RAM devices tradenamed NOVRAM. As set forth in the product literature, the XICOR device is available in three different array sizes the X2212, a 256×4 bit array, the X2210, a 64×4 bit array, and the X2201A, a 1024×1 bit array. The number of devices used depends on the amount of nonvolatile storage desired. In a basic arrangement at least one X2212 device is used for the shadow RAM 122. This permits the storing of 128 pieces of 8-bit information.

The PC 10 can be programmed to provide the LOAD and STORE signals to the memory device 100. In this mode of operation when the PC 10 powers down or is deenergized, it stores the dynamic memory information of the RAM memory 24 into the shadow RAM 122. When the PC is reenergized or powers up, the processor 20 uses an external output of the I/O interface 26 to initiate the LOAD operation of the memory device 100. This LOAD operation, when performed, restores the data that was in the memory of the PC. This sequence of events assumes that the user program is already present in the standard EEPROM array 120 contained in the memory device. With the memory device attached to the PC and controlled as indicated, the PC operates as though it has non-volatile memory even though the memory in the programmable controller itself is still volatile RAM.

The external interface 40 between the programmable controller and the memory device can be achieved through the use of a multi-pin mating connector. Preferably, the connector on the PC has threaded inserts while that of the memory device has captive screws for engaging the threaded inserts. This ensures a secure connection between the two devices. In addition after attachment of the memory device 100 to the PC 10, a frangible tampering indicator such as a thin adhesive backed paper label can be permanently attached across both portions of the connector. Removal of the memory device 100 from the PC 100 would break the tampering indicator; providing visual indication of an unauthorized removal of the memory device 100.

Figure 2A:
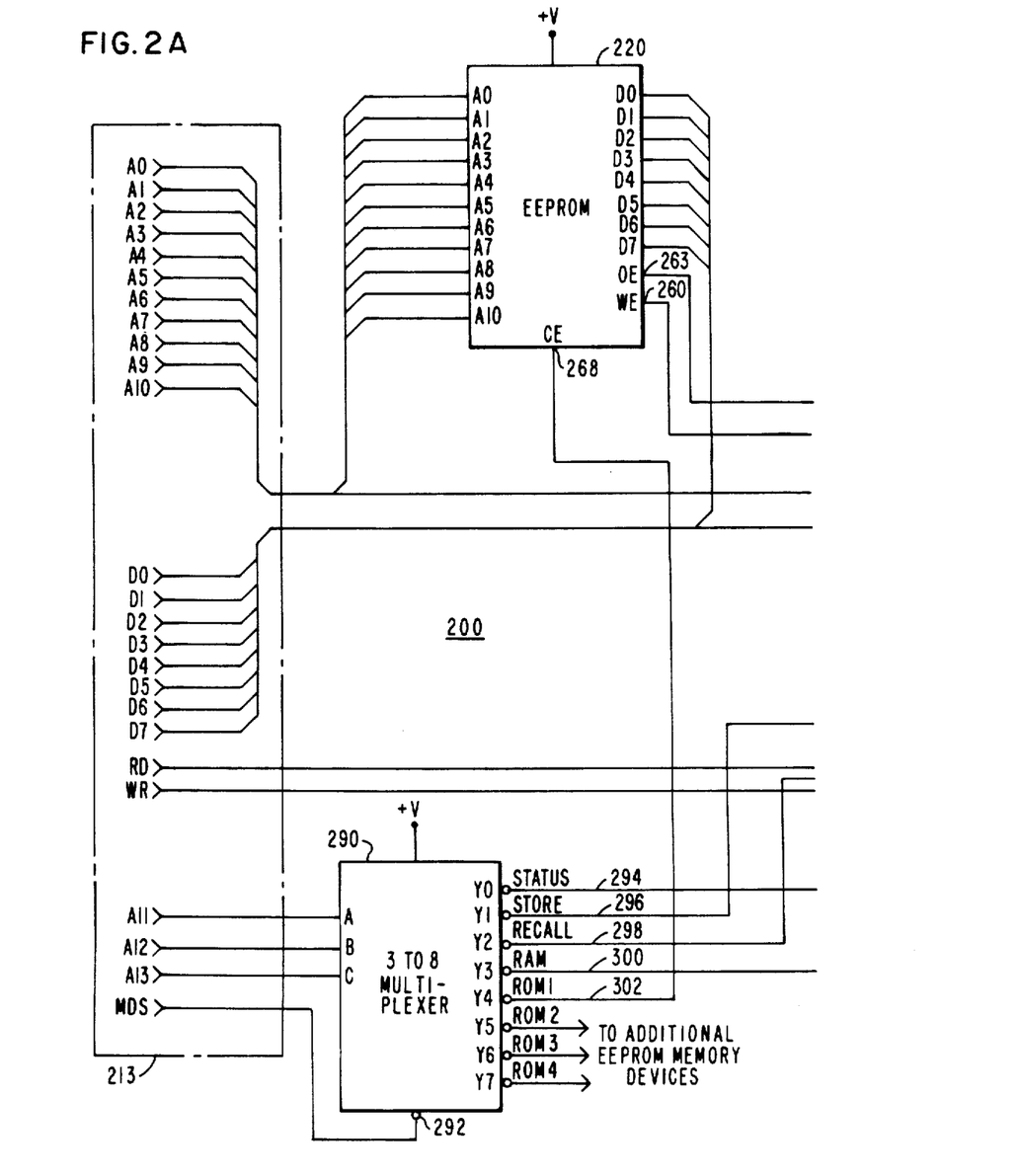
FIGS. 2A and 2B are a detailed schematic embodying the present invention.
Figure 2B:
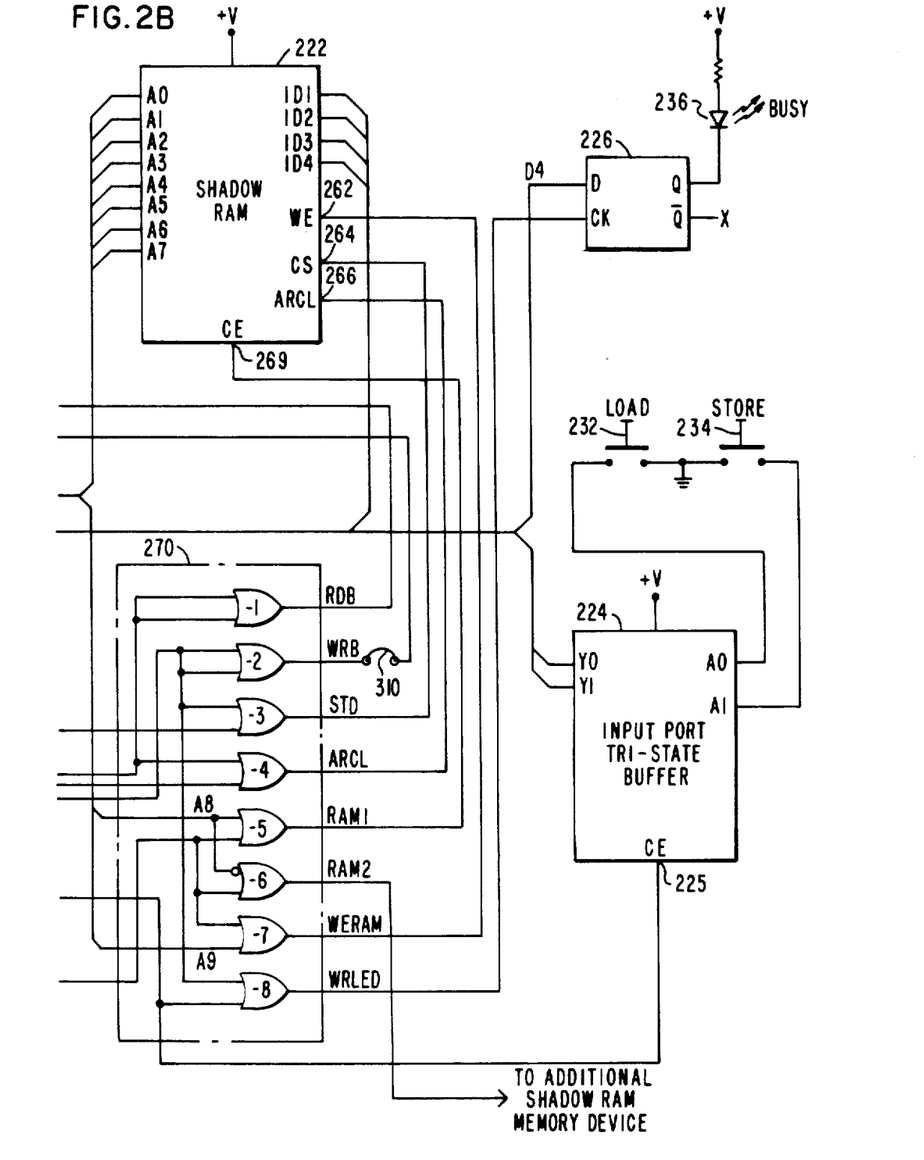

In FIGS. 2A and 2B a detailed implementation of the block diagram shown in FIG. 1 is set forth. Shown there is the schematic diagram for the memory device 200. The data bus 212 consists of address lines A0–A13, data lines D0–D7 and a read control line RD, a write control line WR and a memory device select control line MDS that connect to the PC via the interface connector 213. In the following description, the read control, write control, and memory device control lines are active low. The input port 224 is an 8 input 8 output tri-state buffer such as a 74LS244. Connected to two of the inputs A0 and A1 of the input port 224 are switches 232 and 234 representing the LOAD and STORE signals respectively. The chip enable (CE) input 225 of the port 224 is connected to the STATUS output of the gating circuits described hereinafter. When enabled, the outputs Y0 and Y1 of the input port 224 are transferred onto the data lines D0 and D1 now representing the LOAD and STORE signals, respectively. The output port 226 is a D flip-flop whose clock input CK is controlled by the gating circuits. The Q output of the output port 226 is connected to a light emitting diode 236 that when lit provides the BUSY indication signal. The D input of the output buffer 226 is connected to data line D4. The non-volatile RAM of the memory device is comprised of two circuits, a conventional by 2k×8 bit EEPROM array 220 such as a Xicor, Inc. No. 2816A EEPROM array and a 256 by 4 bit shadow RAM array 222. The eleven line address bus of device 220 is connected to address lines A0 through A10 with the eight line data bus thereof connected to the address lines D0 through D7. Similarly, the eight line address bus of device 222 is connected to address lines A0 through A7 while its four line data bus is connected to data lines D0 through D1. Both devices 220 and 222 have write enable (WE) inputs 260 and 262, respectively, that when activated enable data to be written into these devices. Device 220 also has an output enable (OE) input 263 that when active allows the data contained in the EEPROM array to be read. With device 222 when the write enable input is inactive the device act as read only memory arrays. The shadow RAM 222 has additional inputs 264 and 266 designated chip store CS and array recall ARCL respectively. When active, the chip store input 264 enables the data contained in the NMOS array of the shadow RAM to be written into the overlaying EEPROM of that device. The array recall input 266 when active allows the information contained in the EEPROM of the shadow RAM to be transferred to the NMOS array thereof for use by the programmable controller. In addition, devices 220 and 222 contain chip enable (CE) inputs 268 and 269 respectively that must be active in order for the chip to function.

Selection of devices 220, 222, 224 and 226 is accomplished by the gating circuit consisting of devices 270 and 290. Device 270 is an array of two input NOR gates 270-1 through 270-8. Device 290 is a three-to-eight multiplexing circuit. The three inputs A, B, C of device 290 are connected to address lines A11 through A13, respectively. The CE input 292 is connected to the MDS control line. For the devices shown in FIG. 2 only five of the output lines of device 290 are necessary for operation of the memory device 200. The outputs Y0-Y4 of device 290 are designated STATUS 294, STORE 296, RECALL 298, RAM 300, and ROM 302. The outputs Y5-Y7, designated ROM2, ROM3, AND ROM4, respectively, of the device 270 are used for controlling additional EEPROM arrays that can be added to the memory device if larger memory capacity is required. As with the read and write control lines RD and WR, the outputs of the multiplexer 290 are also active low as indicated by the inverters shown on these outputs. The STATUS output 294 serves as an input to OR gate 270-8 and also as the CE input 225 to input port 224. The STORE output 296 serves as input to NOR gate 270-1. The RECALL output 298 serves as input to NOR gate 270-4. The RAM output 300 serves as input to NOR gates 270-5, 270-6 and 270-7 and the ROM output 302 serves as the CE input 268 to device 220.

The read line RD from the PC serves as both inputs to NOR gate 270-1 and as an input to NOR gate 270-4. The write line WR of the PC serves as both inputs to NOR gate U5-2 and is one of the inputs to NOR gates 270-3 and 270-8. NOR gates 270-1 and 270-2 act as inverters for these signals. The read output RDB of NOR gate 270-1 is connected to the OE input 263 of device 230. The write output WRB of NOR gate 270-2 is connected via a removable jumper 310 to the WE input 260 of device 220. The store output STD of NOR gate 270-3 is connected to the CS input 264 of device 222 while the recall output ARCL of NOR gate 270-4 is connected to the array recall input 266 of device 222. Connected to one of the inputs of NOR gate 270-5 and NOR gate 270-6 is address line A8. The output RAM1 of NOR gate 270-5 is connected to the CE input 270 of device 222. The output RAM2 of NOR gate 270-6 is for a second shadow ram device that can be added to increase the memory capacity of the memory device. Where two shadow ram devices are installed, the value of the address bit A8 determines which shadow ram device will be selected. An inverter on the A8 input to NOR gate 270-6 ensures that the outputs of NOR gate 270-5 and 270-6 are mutually exclusive. The address line A9 serves as one input to NOR gate 270-7 whose write enable output WERAM is connected to the write enable input 262 of the device 222. When the shadow ram device 222 is selected, the value of the address bit A9 determines if data can be written into the shadow ram. The write line WR and the status request line STATUS serve as the two inputs to OR gate 270-8 whose output WRLED is connected to the clock input CK of the output port device 226. The outputs of the NOR gate array are active high.

In operation the memory device 200 would be under the control of the processor in the PC. The processor would enable the multiplexer 290 via the MDS line and request the status of the input port 224 via address lines A11-A13. An active STATUS output 294 enables the input port 224 allowing the state of the switches 232 and 234 to be written on to the data bus and transmitted to the processor. The processor would determine if a LOAD or STORE signal was present on the data bus. In the event a LOAD signal is received, the processor would select the appropriate location in the volatile PC memory to receive the information about to be read from the memory device. The processor would select either the EEPROM device 220 or the shadow RAM device 222 to be read. Selection of either device deactivates the STATUS output 294 disabling the input port 224. For selecting device 220 the ROM1 output 302 of the multiplexer 290 would be active; for device 222 the RAM output 300 would be active. Once device 220 is selected via the ROM1 output 302, an active read line RD will activate the output enable input 263 of the device 220 via the NOR gate 270-1 and its output RDB. The contents of the EEPROM memory array 220 can now be read out on to the data lines D0 through D7 according to the address given at its input address bus A0 through A10 and sent to the designated memory location in the PC. Because the read signal RD also serves as an input to NOR gate 270-4 whose output ARCL controls the array recall input ARCL of the shadow RAM 222 the contents of the shadow RAM would be available if this device was selected. The RAM output 300 of the multiplexer 290. The RAM1 output of NOR gate 270-5 is active the RAM output 300 and the address A8 are active. An active RAM1 output together with an active ARCL output of NOR gate 270-4 allow the information contained in the EEPROM portion of the shadow RAM 222 to be recalled into the NMOS array thereof where it can be sent onto the data bus 212. Because the memory arrays within the memory device share the same data and address lines the processor and the gating circuit ensure that only one of the devices 220 or 222 is being read or written into at any given time.

In the storing of information into the memory arrays of the memory device a similar procedure is followed. The processor in the programmable controller polls the input port 224 via the STATUS line of the multiplexer 290 to determine if a STORE signal is present. If such is the case, the processor then activates the write line WR and selects the particular device into which the data will be written. Although it is dependent upon a particular application, in general information that does not change frequently, such as the user program, would be written into the EEPROM memory array 220 also termed the static memory array. The information that is of a more dynamic nature such as the contents of counters or timers would be written into the shadow RAM 222. If the shadow RAM 222 were being written into address line A9 would be active thereby enabling the write enable input 262 of device 222 via the output WERAM of NOR gate 270-7. With the static memory array device 220 being selected, writing would occur when the write enable input WE thereof is activated via the output WRB of NOR gate 270-2. If the designer of a control system utilizing the programmable controller desires that his user program remain unchanged, jumper 310 at the output WRB of NOR gate 270-2 can be removed. This permanently disables the writing of information into memory device 220 which typically contains the user program. A similar jumper could be provided in the output line WERAM of OR gate 270-7 to disable the writing of information into the shadow RAM 222. However, in most cases this is not necessary in that memory device 222 contains that it is of a less permanent character than that typically contained in memory device 220.

For applications requiring more storage additional EEPROM devices and shadow RAM devices can be included in the memory device. For the circuit shown in FIG. 2 an additional shadow RAM device and three additional EEPROM memory array devices can be implemented. An additional output port consisting of a D type flip-flop can be added to provide an additional output indication on the memory device. This output indicator would be controlled by the processor to indicate that an error has occurred during the exchange of information between the memory device and the memory arrays of the PC.

Other embodiments of the invention will be apparent to those skilled in the art from a consideration of the specification or from practice of the invention disclosed herein. It is intended that the specification be considered as exemplary only with the scope and spirit of the present invention being indicated by the following claims.

We claim:

1. In a programmable controller including a data bus having data, address and control lines and having connected thereto a processor, input device means in communication with the processor via the data bus and external input devices for transmitting information from external input devices to the processor, output device means in communication with the processor via the data bus and external output devices for transmitting information from the processor to the external output devices, volatile memory means for containing static information including a control program for controlling the outputs dependent on the status of the inputs and dynamic information including the status of timers and counters, and an external interface, a nonvolatile memory device for retaining the static and dynamic information contained in the volatile memory when the programmable controller is deenergized, comprising:

a memory device data bus having data, address, and control lines;

interface connection means in connection with the memory device data bus for removably attaching the memory device to the external interface of the programmable controller thereby connecting the memory data bus to the programmable controller data bus when the memory device is so attached;

controllable nonvolatile random access memory (RAM) means connected to the memory device data bus for storing information received via the memory device data bus, the nonvolatile RAM means retaining the information contained therein during the periods of time when the programmable controller is deenergized;

controllable input port means connected to the memory device data bus for receiving external signals including a LOAD signal for the leading of information contained in the nonvolatile RAM means into the processor and a STORE signal for the writing of information from the processor into the nonvolatile RAM means of the memory device, the LOAD signal and the STORE signal being transmitted to the processor on the occurrence thereof;

controllable output port means connected to the memory device data bus for providing a BUSY indicator when information is being transferred between the memory device and the central processor; and gating circuit means responsive to the processor with the nonvolatile RAM means, the input port means, and the output port means being responsive to the gating circuit means, when enabled by the processor the gating circuit means:

(a) controlling the direction of information flow into and out of the nonvolatile RAM means in response to the occurrence of the STORE signal and the LOAD signal, respectively;

(b) enabling the output port means to provide the BUSY signal; and (c) disabling the input port means until the transfer of information between the memory device and the programmable controller has been completed.

2. The apparatus of claim 1 wherein the nonvolatile memory means comprises:

shadow RAM means for the storage of information connected to the memory device data bus and having a SELECT input responsive to the processor of the programmable controller via the gating circuit means, the shadow RAM means comprising:

static RAM array means having a plurality of memory cells for the volatile storage of information and a first READ/WRITE enable input responsive to the processor of the programmable controller via the gating circuit means; and electronically erasable programmable read only memory (EEPROM) array means having a plurality of memory cells corresponding in number to those of the static RAM array means, each memory cell of the EEPROM array means overlaying a corresponding cell in the static RAM array means, the EEPROM array means providing for the nonvolatile storage of the information contained therein when the programmable controller is deenergized and having a second READ/WRITE enable input responsive to the processor via the gating circuit means whereby the overlaying of the EEPROM array means allows for the direct transfer of information contained in either memory array means to the other in a single operation;

on selection of the shadow RAM array means by the processor via the SELECT input thereto, the static RAM array means:

(a) providing for the volatile storing the information contained in the memory means of the programmable controller when write enabled by the processor via the first READ/WRITE enable input; and (b) providing the information contained therein to the programmable controller when read enabled by the processor via the first READ/WRITE enable input; and the overlaid EEPROM array means:

(a) providing for the nonvolatile storing of the information contained in the static RAM array means when write enabled by the processor via the second READ/WRITE enable input; and (b) providing the information contained therein to the static RAM array means when read enabled by the processor via the second READ/WRITE enable input.

3. The apparatus of claim 2 wherein the nonvolatile memory means further comprises:

the shadow RAM array means storing the dynamic information contained by the memory means of the programmable controller when the programmable controller is deenergized; and second EEPROM array means connected to the memory device data bus and having a READ/WRITE enable input and a SELECT input with both inputs being responsive to the processor of the programmable controller via the gating circuit means, the second EEPROM array means retaining the static information contained therein when the programmable controller is deenergized and when selected by the processor:

(a) storing the static information contained in the memory means of the programmable controller when write enabled by the processor with the writing of information into cells of the array occurring cell by cell; and (b) providing the static information contained therein to the programmable controller when read enabled by the processor.

4. The apparatus of claim 3 further comprising:
the second EEPROM array means containing preprogrammed information supplied thereto prior to the attachment of the memory device to the programmable controller; and means for preventing the second EEPROM array means from being write enabled by the processor thereby preventing the overwriting of preprogrammed information contained therein.

5. The apparatus of claim 4 further comprising frangible tampering indicator means permanently attached to the memory device and to the programmable controller, the tampering indicator means being broken on the removal of the memory device from the external interface of the programmable controller with the broken tampering indicator means providing visible indication of the removal of the memory device.

6. The apparatus of claim 1 further comprising means for inhibiting the STORE input signal so that the information contained in the nonvolatile RAM means of the memory device cannot be overwritten by information contained in the programmable controller.

7. The apparatus of claim 6 further comprising frangible tampering indicator means permanently attached to the memory device and to the programmable controller, the tampering indicator means being broken on the removal of the memory device from the external interface of the programmable controller with the broken tampering indicator means providing visible indication of the removal of the memory device.

8. In a programmable controller including a data bus having data, address and control lines and having connected thereto a processor, input device means in communication with the processor via the data bus and external input devices for transmitting information from external input devices to the processor, output device means in communication with the processor via the data bus and external output devices for transmitting information from the processor to the external output devices, volatile memory means for containing static information including a control program for controlling the outputs dependent on the status of the inputs and dynamic information including the status of timers and counters, and an external interface, a nonvolatile memory device for retaining the static and dynamic information contained in the volatile memory when the programmable controller is deenergized, comprising:

a memory device data bus having data, address and control lines;

interface connection means in connection with the memory device data bus for removably attaching the memory device to the external interface of the programmable controller system thereby connecting the memory data bus to the programmable control system data bus when the memory device is so attached;

controllable nonvolatile RAM means connected to the memory device data bus for loading information into the programmable controller and for storing information from the central processor via the memory device data bus and the programmable controller system data bus, the nonvolatile RAM means retaining the information contained therein without the use of an auxiliary power source during the periods of time when the central processor is deenergized;

controllable input port means connected to the memory device data bus for receiving external signals including a LOAD signal for the loading of information from the memory device into the central processor and a STORE signal for the writing the information from the central processor into the memory device with the LOAD signal and STORE signal being outputs from the central processor via the I/O module, the LOAD signal being present when the programmable controller system is energized and the STORE signal being present when the programmable controller system is deenergized thereby automatically loading information from the memory device on the energization of the programmable controller system and storing information in the memory device on deenergization of the programmable controller system;

controllable output port means connected to the memory device data bus for providing a first output indicator when information is being transferred between the memory device and the central processor; and gating circuit means responsive to the processor with the nonvolatile RAM means, the input port means, and the output port means being responsive to the gating circuit means, when enabled by the processor the gating circuit means:

(a) controlling the direction of information flow into the out of the nonvolatile RAM means in response to the occurrence of the STORE signal and the LOAD signal, respectively;

(b) enabling the output port means to provide the BUSY signal; and (c) disabling the input port means until the transfer of information between the memory device and the programmable controller has been completed.

9. The apparatus of claim 8 wherein the nonvolatile memory means comprises:

shadow RAM means for the storage of information connected to the memory device data bus and having a SELECT input responsive to the processor of the programmable controller via the gating circuit means, the shadow RAM means comprising:

static RAM array means having a plurality of memory cells for the volatile storage of information and a first READ/WRITE enable input responsive to the processor of the programmable controller via the gating circuit means; and electronically erasable programmable read only memory (EEPROM) array means having a plurality of memory cells corresponding in number to those of the static RAM array means each memory cell of the EEPROM array means overlaying a corresponding cell in the static RAM array means, the EEPROM array means providing for the nonvolatile storage of the information contained therein when the programmable controller is deenergized and having a second READ/WRITE enable input responsive to the processor via the gating circuit means whereby the overlaying of the EEPROM array means allows for the direct transfer of information contained in either memory array means to the other in a single operation;

on selection of the shadow RAM array means by the processor via the SELECT input thereto, the static RAM array means:

(a) providing for the volatile storing the information contained in the memory means of the programmable controller when write enabled by the processor via the first READ/WRITE enable input; and (b) providing the information contained therein to the programmable controller when read enabled by the processor via the first READ/WRITE enable input; and the overlaid EEPROM array means:

(a) providing for the nonvolatile storing of the information contained in the static RAM array means when write enabled by the processor via the second READ/WRITE enable input; and (b) providing the information contained therein to the static RAM array means when read enabled by the processor via the second READ/WRITE enable input.

10. The apparatus of claim 9 wherein the nonvolatile memory means further comprises:

the shadow RAM array means storing the dynamic information contained by the memory means of the programmable controller when the programmable controller is deenergized; and second EEPROM array means connected to the memory device data bus and having a READ/WRITE enable input and a SELECT input with both inputs being responsive to the processor of the programmable controller via the gating circuit means, the second EEPROM array means retaining the static information contained therein when the programmable controller is deenergized and when selected by the processor:

(a) storing the static information contained in the memory means of the programmable controller when write enabled by the processor with the writing of information into cells of the array occurring cell by cell; and (b) providing the static information contained therein to the programmable controller when read enabled by the processor.

11. The apparatus of claim 10 further comprising:

the second EEPROM array means containing preprogrammed information supplied thereto prior to the attachment of the memory device to the programmable controller; and means for preventing the second EEPROM array means from being write enabled by the processor thereby preventing the overwriting of preprogrammed information contained therein.

12. The apparatus of claim 11 further comprising frangible tampering indicator means permanently attached to the memory device and to the programmable controller, the tampering indicator means being broken on the removal of the memory device from the external interface of the programmable controller with the broken tampering indicator means providing visible indication of the removal of the memory device.

13. The apparatus of claim 8 further comprising means for inhibiting the STORE input signal so that the information contained in the nonvolatile RAM means of the memory device cannot be overwritten by information contained in the programmable controller.

14. The apparatus of claim 13 further comprising frangible tampering indicator means permanently attached to the memory device and to the programmable controller, the tampering indicator means being broken on the removal of the memory device from the external interface of the programmable controller with the broken tampering indicator means providing visible indication of the removal of the memory device.

* * * * *